United States Patent [19]

Jastrzebski

[11] Patent Number: 4,772,568

[45] Date of Patent: Sep. 20, 1988

[54] METHOD OF MAKING INTEGRATED CIRCUIT WITH PAIR OF MOS FIELD EFFECT TRANSISTORS SHARING A COMMON SOURCE/DRAIN REGION

[75] Inventor: Lubomir L. Jastrzebski, Plainsboro, N.J.

[73] Assignee: General Electric Company, Schenectady, N.Y.

[21] Appl. No.: 55,220

[22] Filed: May 29, 1987

[51] Int. Cl.$^4$ .................. H01L 21/425; H01L 21/365
[52] U.S. Cl. ...................................... 437/34; 437/89; 437/156; 437/913; 437/915
[58] Field of Search .................. 437/41, 89, 156, 913, 437/915, 34

[56] References Cited

U.S. PATENT DOCUMENTS

| | | | |
|---|---|---|---|
| 4,272,880 | 6/1981 | Pashley | 437/19 |
| 4,349,394 | 9/1982 | Wei | 437/89 X |
| 4,555,843 | 12/1985 | Malhi | 437/34 |
| 4,603,468 | 8/1986 | Lam | 437/57 |
| 4,628,589 | 12/1986 | Sundaresan | 437/34 |
| 4,637,127 | 1/1987 | Kurogi et al. | 437/89 X |
| 4,651,408 | 3/1987 | MacElwee et al. | 437/89 X |
| 4,686,758 | 8/1987 | Liu | 437/34 |
| 4,698,316 | 10/1987 | Corboy, Jr. et al. | 437/89 |

Primary Examiner—George T. Ozaki
Attorney, Agent, or Firm—Henry I. Steckler; James C. Davis, Jr.; Paul R. Webb, II

[57] ABSTRACT

The present invention is a method of making an integrated circuit device including a pair of MOSFETs each of which has a source or drain region which shares a common active region with the other. The method includes forming an epitaxial layer from nucleation sites, one of which is the source or drain region of the first MOSFET. The second MOSFET is then formed in the epitaxial layer so that one of the source or drain regions extends from one of the nucleation sites.

5 Claims, 2 Drawing Sheets

METHOD OF MAKING INTEGRATED CIRCUIT WITH PAIR OF MOS FIELD EFFECT TRANSISTORS SHARING A COMMON SOURCE/DRAIN REGION

This invention relates to a method of making MOS field effect transistors (MOSFETs) for an integrated circuit device wherein the source or drain region of one MOSFET extends from the source or drain region of the other MOSFET.

BACKGROUND OF THE INVENTION

In recent years, various three dimensional integrated circuit devices have been proposed to meet the increasing need for higher density integrated circuits. Attempts to fabricate MOSFET devices stacked on the top of bulk silicon MOSFETs include the recrystallization of a polycrystalline silicon layer formed over the bulk silicon MOSFET. Typically, the recrystallization procedure would include a heat treatment for a period of one hour or more at a temperature exceeding about 950° C. Such a procedure may cause excessive diffusion of the N+ and P+ regions of the bulk MOSFETs compromising the potential performance of VLSI circuit devices fabricated in this way.

What is needed is a structure and method of making that structure which avoids the need for a high temperature, long duration heat treatment.

SUMMARY OF THE INVENTION

The present invention relates to a method of making an integrated circuit device including a pair of MOSFETs, each of which has a source or drain region sharing a common active region with the other, thereby requiring less chip space. A first insulated gate is formed on a planar surface of a body of semiconducting material. Highly doped first and second regions, and a doped third region of one of either conductivity type are formed in the body, the first, second, and third regions being spaced apart and extending inwardly from the planar surface. The first and second regions are spaced to define a first channel region therebetween that is in substantial alignment with the first gate. A continuous layer of monocrystalline silicon is formed using the second and third regions as nucleation sites, one portion of the layer extending from the second region and another portion of the layer extending from the third region. The continuous layer is of the same conductivity type as the second and third regions. A second insulated gate is formed on a portion of the continuous layer of monocrystalline silicon that does not extend from the second region. Highly doped fifth and sixth regions of opposite conductivity type to that of the first, second, and third regions are formed on either side of the second gate thereby defining a second channel region therebetween that is in substantial alignment with the second gate. The fifth region is formed in the portion of the layer of monocrystalline silicon that extends from the second region.

DESCRIPTION OF THE PREFERRED EMBODIMENT

In the following description and as shown in FIGS. 1 through 6, specific P and N conductivity type materials and regions are indicated. These indications are by way of example and should not be deemed to limit the teachings of the present invention. It will be understood that devices having opposite P and N arrangements are considered equivalent in all pertinent respects to the devices described herein.

Figure 1:
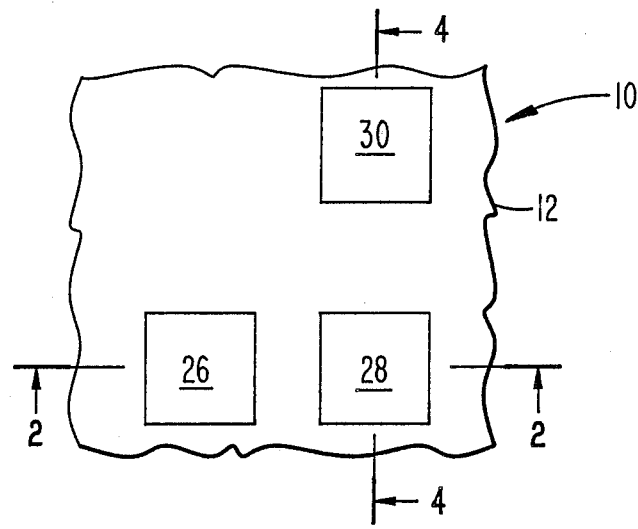
FIG. 1 is a plan view of a portion of an integrated circuit device showing the positional relationship of three regions of a pair of MOSFETs.
Figure 2:
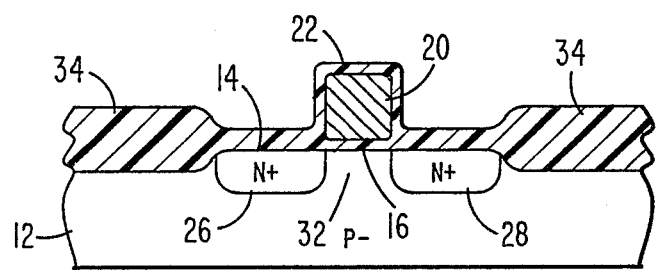
FIGS. 2, 3, and 8 are schematic representations of cross-sectional views taken along the lines 2—2 of FIG. 1 showing the structure and various steps of manufacture of the pair of MOSFETs utilizing the teachings of the present invention.
Figure 3:
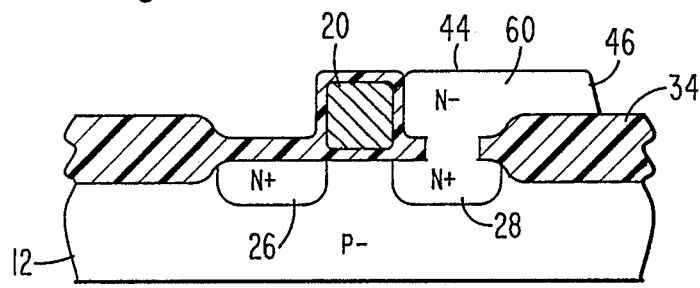
Figure 4:
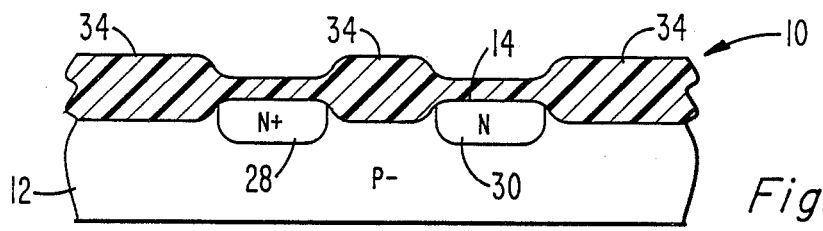
FIGS. 4, 5, 6, and 7 are cross-sectional views similar to those of FIGS. 2 and 3 but taken along the lines 4—4 of FIG. 1.

There is shown in FIGS. 1 through 8 a portion of an integrated circuit device 10 including a semiconducting body 12 of a first conductivity type material, which is lightly doped P type in the present example, having a planar surface 14. A relatively thin layer 16 of insulating material, such as silicon oxide, is disposed on a portion of the surface 14 and a gate electrode 20, which may be of any suitable metal, metal silicide, or doped silicon, is disposed on the insulating layer 16 as best seen in FIG. 2. Another layer 22 of insulating material, such as silicon oxide, is arranged to cover all exposed surfaces of the gate 20. First, second, and third regions 26, 28, and 30 are disposed in the body 12 as shown in FIGS. 1, 2, and 4. The first and second regions 26 and 28 are the source and drain regions of a first MOSFET and define a first channel 32 therebetween. The purpose of the third region 30 will be set forth in detail below. The first, second, and third regions, while they may be of either conductivity type are, in the present example, doped second conductivity type, or N type. These regions are formed by any suitable technique that is well known in the art such as arsenic implantation. A layer 34 of isolation oxide is formed in the usual manner and is arranged to electrically isolate the various components of the integrated circuit.

The specific materials and processing techniques utilized to obtain the device 10, as depicted in FIGS. 1, 2, and 4 are well known in the art and any suitable one of the several well known procedures in use today may be advantageously employed. The device 10, as depicted in these figures, represents the starting structure to which the unique features of the present invention are combined.

Figure 5:
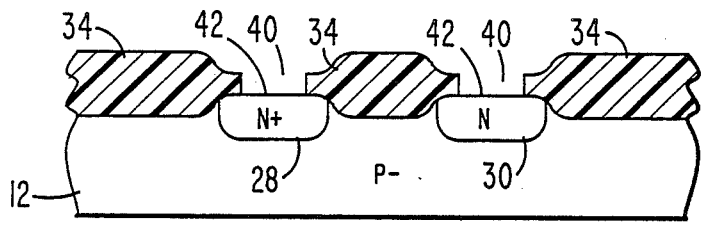
Figure 6:
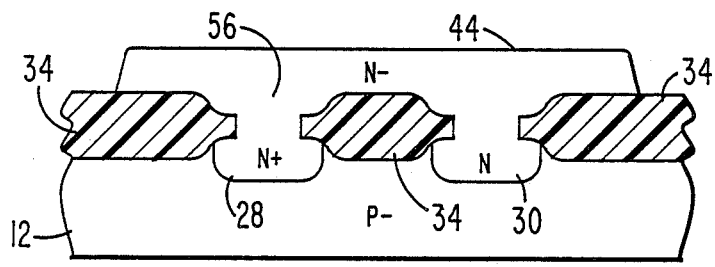

As shown in FIG. 5, a pair of openings 40 are formed in the oxide layer 34, one being over a portion of the second region 28 and the other over a portion of the third region 30 thereby exposing portions of the planar surface 14 in these areas. The exposed portions of the surface 14 constitute nucleation sites 42 which are used to grow a layer 44 of monocrystalline silicon within which the second of the pair of MOSFETs will be formed. Such monocrystalline silicon layers can be fabricated utilizing the epitaxial lateral overgrowth (ELO) fabrication technique that is well known in the art. See, for example U.S. Pat. No. 4,549,926 which issued Oct. 29, 1985 to Corboy, Jr. et al, and U.S. Pat. No. 4,578,142 which issued Mar. 25, 1986 to Corboy, Jr., et al. These patents describe in detail the ELO fabrication technique. Briefly, the ELO process involves a repetitious, two phase, deposition/etch cycle whereby monocrystalline silicon is grown from a monocrystalline surface which is exposed within the aperture of an overlying mask. In the present case, the layer 44 overgrows the oxide layer 34 to cover the regions 28 and 30 and to at least slightly overlap the areas of the layer 34 of field oxide adjacent the regions 28 and 30. The layer 44 should be grown to a thickness of about 500 nm. Excellent crystal quality can be obtained with this process. The layer 44 may then be etched in the usual manner to define its periphery 46 should this become desirable. As is shown in FIGS. 3 and 6, the layer 44 extends upwardly from the second and third regions 28 and 30. Since the layer 44 is grown from the nucleation sites 42, it takes on the single crystal structure of the regions 28 and 30. The doping concentration of portions of the layer 44 that are not directly adjacent the nucleation sites 42 is somewhat reduced as indicated by the N−symbol.

Figure 7:
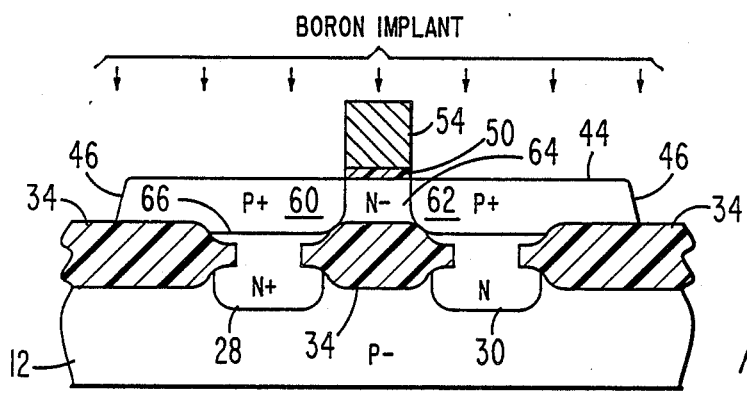
Figure 8:
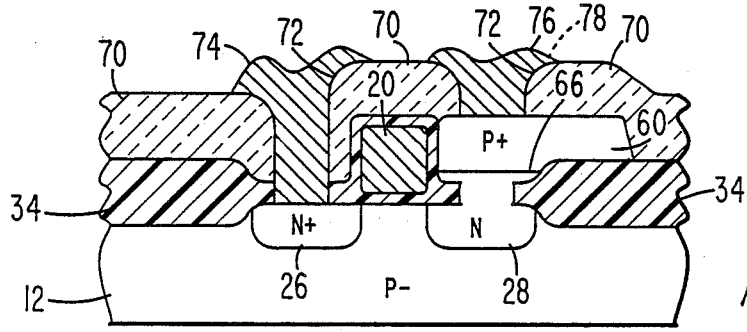

A relatively thin layer 50 of insulating material, such as silicon oxide, is disposed on the surface of the layer 44 as shown in FIG. 7. A gate electrode 54, which may be of any suitable metal, metal silicide, or doped silicon, is formed on the layer 50 so that the gate 54 is electrically insulated from the layer 44. The layer 50 of $SiO_2$ and the gate 54 are formed in a manner that is well known in the art and, therefore, will not be described here. After suitable masking, the device 10 is then subjected to a low energy boron implantation, as shown in FIG. 7, to form a fourth region 60 and a fifth region 62 which are spaced to define a second channel 64 therebetween. The implantation energy level should be selected to preclude the penetration by boron ions into the second region 28. An energy level of about 68 kev at a concentration of about $10^{15}$ atoms $cm^{-2}$ would be appropriate. While this method, results in a PN junction 66 being formed between the second region 28 and the fourth region 60, there will be no operational consequence as long as the junction 66 is forward biased. This, of course, would be the case in inverter applications for which the present invention may be advantageously utilized.

It will be seen by those skilled in the art that the fourth and fifth regions 60 and 62 are the source and drain regions of a second MOSFET having the gate 54. The layer 50 and gate 54 should be positioned on a portion of the layer 44 that is not over the portion 56 which extends from the region 28 as best seen in FIGS. 6 and 7. This will assure that the channel region 64 is not adversely influenced by the operation of the first MOSFET. The device 10 is then heated in an oxidizing atmosphere to form a layer of silicon oxide on all surfaces of the gate 54 and the exposed surfaces of the continuous layer 44 of monocrystalline silicon. A relatively thick layer 70 of BPSG or similar reflow glass is formed over the entire device 10 in a manner that is well known in the art. The device is then heated to about 850° C. for 30 minutes to flow the layer 70 in the usual manner. Contact openings 72 are formed and metal contacts 74, 76, and 78 are then formed in ohmic contact with the first, fourth, and fifth regions 26, 60, and 62, respectively, in a manner that is well known in the art. Note that the contact 76 serves as the contact for both the second region 28 of the first MOSFET and the fourth region 60 of the second MOSFET. Any suitable process that is well known in the art may be utilized to complete the integrated circuit device. This would include metallization to interconnect various portions of the integrated circuits and passivation procedures.

While the region 30 is shown positioned offset with respect to the regions 26 and 28 as best seen in FIG. 1, it will be understood by those skilled in the art that the teachings of the present invention may be advantageously utilized with the three regions 26, 28, and 30 positioned in approximate alignment. The only requirement is that the second and third regions 28 and 30 be spaced apart between about 0.5 micron to about 2.0 microns.

One of the important advantages of the present invention is that its process yields a relatively compact device structure for use in applications requiring back to back MOSFETS having a common source or drain region such as an inverter, or any CMOS circuit where the diode formed by the PN junction 66 may be forward biased. This compact device structure is achieved by the novel three dimensional character of the structure whereby one of the source or drain regions of the first MOSFET is vertically stacked upon one of the source or drain regions of the second MOSFET.

What is claimed is:

1. In a method of making an integrated circuit device including a body of semiconducting material of a first conductivity type having a planar surface and a pair of MOSFETs each of which has a source or drain region which shares a common active region with the other, the steps comprising:

(a) forming a first insulated gate on said planar surface;

(b) forming highly doped first and second regions, and a third region of of of either conductivity type in said body, the first, second, and third regions being spaced apart and extending inwardly from said planar surface, said first and second regions being spaced to define a first channel region therebetween that is in substantial alignment with said first gate;

(c) forming a continuous layer of monocrystalline silicon using said second and third regions as nucleation sites wherein one portion of said continuous layer extends from said second region and another portion extends from said third region, said layer of single crystalline silicon being of the same conductivity type as said second and third regions;

(d) forming a second insulated gate on a portion of said continuous layer of monocrystalline silicon other than said one portion extending from said second region; and (e) forming highly doped fourth and fifth regions of conductivity type opposite that of said first, second, and third regions in said layer of monocrystalline silicon spaced to define a second channel region therebetween that is in substantial alignment with said second gate, wherein said fourth region is in said one portion of said layer of monocrystalline silicon that extends from said second region.

2. The method as set forth in claim 1 wherein said body of semiconducting material has a monocrystalline portion within each of said second and third regions at said planar surface.

3. The method set forth in claim 2 wherein step (c) includes forming said continuous layer of monocrystalline silicon by means of epitaxial lateral overgrowth.

4. The method set forth in claim 3 wherein said fourth region extends into said continuous layer of monocrystalline silicon a distance of less than the thickness of said continuous layer.

5. The method set forth in claim 4 wherein said continuous layer of monocrystalline silicon is formed to a thickness of about 500 microns.

* * * * *